(12) United States Patent
Henning et al.

(10) Patent No.: US 8,803,277 B2
(45) Date of Patent: Aug. 12, 2014

(54) JUNCTION TERMINATION STRUCTURES INCLUDING GUARD RING EXTENSIONS AND METHODS OF FABRICATING ELECTRONIC DEVICES INCORPORATING SAME

(75) Inventors: Jason Henning, Carborro, NC (US); Qingchun Zhang, Cary, NC (US); Sei-Hyung Ryu, Cary, NC (US)

(73) Assignee: Cree, Inc., Durham, NC (US)

( * ) Notice: Subject to any disclaimer, the term of this patent is extended or adjusted under 35 U.S.C. 154(b) by 243 days.

(21) Appl. No.: 13/024,812

(22) Filed: Feb. 10, 2011

(65) Prior Publication Data
US 2012/0205666 A1    Aug. 16, 2012

(51) Int. Cl.
*H01L 29/38*    (2006.01)

(52) U.S. Cl.
USPC ............ 257/496; 257/E29.012; 257/E21.544; 438/420

(58) Field of Classification Search
None
See application file for complete search history.

(56) References Cited

U.S. PATENT DOCUMENTS

| | | | |
|---|---|---|---|
| 4,242,690 A | 12/1980 | Temple | |
| 4,742,377 A | 5/1988 | Einthoven | |
| 4,927,772 A | 5/1990 | Arthur et al. | |
| 5,233,209 A | 8/1993 | Rodgers et al. | |
| 5,726,469 A | 3/1998 | Chen | |
| 5,804,483 A | 9/1998 | Harris | |
| 5,914,500 A | 6/1999 | Bakowski et al. | |
| 5,967,795 A | 10/1999 | Bakowsky et al. | |
| 5,977,605 A | 11/1999 | Bakowsky et al. | |
| 6,083,814 A | 7/2000 | Nilsson | |
| 6,696,705 B1 | 2/2004 | Barthelmess et al. | |
| 6,696,728 B2 * | 2/2004 | Onishi et al. ................. | 257/341 |
| 7,026,650 B2 | 4/2006 | Ryu et al. | |
| 7,144,797 B2 | 12/2006 | Chow et al. | |

(Continued)

FOREIGN PATENT DOCUMENTS

| | | |
|---|---|---|
| DE | 10 2004 045 768 A1 | 4/2006 |
| EP | 0 176 778 A2 | 4/1986 |

(Continued)

OTHER PUBLICATIONS

Asano et al., "Dynamic Characteristics of 6.2kV High Voltage 4H-SiC pn Diode with Low Loss", Transactions of the Institute of Electrical Engineers of Japan, Part D Inst. Electr. Eng. Japan, vol. 123D, No. 5, May 2003, pp. 623-627, XP8124184.

(Continued)

*Primary Examiner* — Wensing Kuo
(74) *Attorney, Agent, or Firm* — Myers Bigel Sibley & Sajovec, PA

(57) ABSTRACT

An electronic device includes a semiconductor layer, a primary junction in the semiconductor layer, a lightly doped region surrounding the primary junction and a junction termination structure in the lightly doped region adjacent the primary junction. The junction termination structure has an upper boundary, a side boundary, and a corner between the upper boundary and the side boundary, and the lightly doped region extends in a first direction away from the primary junction and normal to a point on the upper boundary by a first distance that is smaller than a second distance by which the lightly doped region extends in a second direction away from the primary junction and normal to a point on the corner. At least one floating guard ring segment may be provided in the semiconductor layer outside the corner of the junction termination structure. Related methods are also disclosed.

17 Claims, 5 Drawing Sheets

(56) References Cited

U.S. PATENT DOCUMENTS

| | | | |
|---|---|---|---|
| 7,304,363 | B1 | 12/2007 | Shah |
| 7,649,213 | B2 | 1/2010 | Hatakeyama et al. |
| 7,838,377 | B2 | 11/2010 | Zhang et al. |
| 7,875,946 | B2 | 1/2011 | Yasuoka et al. |
| 2005/0205872 | A1 | 9/2005 | Hallin et al. |
| 2006/0068571 | A1 | 3/2006 | Chow et al. |
| 2006/0118900 | A1 | 6/2006 | Zeghbroeck |
| 2006/0273346 | A1 | 12/2006 | Pfirsch |
| 2007/0001230 | A1 | 1/2007 | Lee et al. |
| 2007/0120148 | A1 | 5/2007 | Nogome |
| 2007/0241427 | A1 | 10/2007 | Mochizuki et al. |
| 2008/0001158 | A1 | 1/2008 | Das et al. |
| 2008/0006848 | A1 | 1/2008 | Chen et al. |
| 2008/0105949 | A1 | 5/2008 | Zhang et al. |
| 2009/0212301 | A1 | 8/2009 | Zhang et al. |
| 2010/0289032 | A1 | 11/2010 | Zhang et al. |

FOREIGN PATENT DOCUMENTS

| | | |
|---|---|---|
| EP | 0 389 863 A1 | 10/1990 |
| EP | 1 806 787 A1 | 7/2007 |
| JP | 55-006887 A | 1/1980 |
| JP | H02-294026 A | 12/1990 |
| JP | H03-094469 A | 4/1991 |
| JP | 3-225870 | 10/1991 |
| JP | 3-225870 A | 10/1991 |
| JP | 4-092434 A | 3/1992 |
| JP | 2000-516767 A | 12/2000 |
| JP | 2001-035857 A | 2/2001 |
| JP | 2002-516027 A | 5/2002 |
| JP | 2007-096006 A | 4/2007 |
| JP | 2007-165604 A | 6/2007 |
| JP | 2007-173841 A | 7/2007 |
| WO | WO 96/03774 | 2/1996 |
| WO | WO 97/08754 A2 | 3/1997 |
| WO | WO 98/02924 A2 | 1/1998 |
| WO | WO 98/32178 A1 | 7/1998 |
| WO | WO 2006/135031 A2 | 12/2006 |
| WO | WO 2006/135031 A3 | 12/2006 |
| WO | WO 2007/040710 A1 | 4/2007 |

OTHER PUBLICATIONS

European Search Report for corresponding EP patent application No. 09163424.6 dated Apr. 9, 2010.

Gao Y. et al., "Investigation of boron diffusion in 6H-SiC", *Applied Physics Letters*, vol. 83, No. 5, Aug. 4, 2003, pp. 905-907.

Gao, Y. et al., "Selective doping of 4H-SiC by codiffusion of aluminum and boron", *Journal of Applied Physics*, vol. 90, No. 11, Dec. 1, 2001, pp. 5647-5651.

Grekhov, I.V. et al., "High-Voltage (900 V) 4H-SiC Schottky Diodes with a Boron-Implanted guard p-n Junction", *Semiconductors*, vol. 42, No. 2, 2008, pp. 211-214.

International Preliminary Report on Patentability Corresponding to International Application No. PCT/US2010/026632; Date of Mailing: Jun. 10, 2011; 15 Pages.

International Search Report and Written Opinion (13 pages) corresponding to International Application No. PCT/US2008/010538; Mailing Date: Dec. 22, 2008.

International Search Report and Written Opinion, International Application No. PCT/US2009/000734, Apr. 23, 2009.

Japanese Office Action Corresponding to Japanese Patent Application No. 2009-186765; Mailing Date: May 8, 2012; Foreign Text, 2 Pages, English Translation Thereof, 2 Pages.

Kinoshita et al., "Guard Ring Assisted RESURF: A New Termination Structure Providing Stable and High Breakdown Voltage for SiC Power Devices," Tech. Digest of ISPSD '02, pp. 253-256.

Losee et al., "High Voltage 4H-SiC PiN rectifiers with single-implant, multi-zone JTE termination", Power Semiconductor Devices and ICS, 2004; Proceedings ISPSD 2004; The 16$^{th}$ International Symposium on Kitakyushu Int. Conf. Ctr. Japan, May 24-27, 2004; Piscataway, NJ, USA, IEEE, May 24, 2004, pp. 301-304, XP010723398.

Merrett, J.N. et al., "Fabrication of Self-Aligned Graded Junction Termination Extensions with Applications to 4H-SiC P-N Diodes", *Journal of Electronic Materials*, vol. 31, No. 6, 2002, pp. 635-639.

Notification of Transmittal of the International Search Report and the Written Opinion of the International Searching Authority, or the Declaration; International Search Report; Written Opinion of the International Searching Authority—Corresponding to International Application No. PCT/US2010/026632; Date of Mailing: Oct. 8, 2010; 16 pages.

Singh, R. and J.W. Palmour, "Planer Terminations in 4H-SiC Schottky Diodes with Low Leakage and High Yields," IEEE International Symposium on Power Semiconductor Devices and ICs, 1997, pp. 157-160.

Solmi, S. et al., "High-concentration boron diffusion in silicon: Simulation of the precipitation phenomena", *Journal of Applied Physics*, vol. 68, No. 7, Oct. 1, 1990, pp. 3250-3258.

Soloviev, S. I. et al., "Doping of 6H-SiC by selective diffusion of boron", *Applied Physics Letters*, vol. 77, No. 24, Dec. 11, 2000, pp. 4004-4006.

Stengl et al., "Variation of Lateral Doping—A New Concept to Avoid High Voltage Breakdown of Planar Junctions", International Electron Devices Meeting; Washington, Dec. 1-4, 1985; pp. 154-157, XP002013050.

Stengl et al., Variation of Lateral Doping as a Field Terminator for High-Voltage Power Devices, IEEE Transactions on Electron Devices; vol. ED-33, No. 3, Mar. 1986, pp. 426-428, XP000836911.

Sundaresan et al., "Ultra-low resistivity Al+ implanted 4H-SiC obtained by microwave annealing and a protective graphite cap", *Solid-State Electronics* vol. 52, 2008, pp. 140-145, XP022360431.

Ueno et al., "The Guard-Ring Termination for the High-Voltage SiC Schottky Barrier Diodes". *IEEE Electron Device Letters*. vol. 16. No. 7, Jul. 1995, pp. 331-332.

Vassilevski et al., "High Voltage Silicon Carbide Schottky Diodes with Single Zone Junction Termination Extension", Materials Science Forum, 2007 Trans Tech Publications, vols. 556-557 (2007) pp. 873-876, XP8124186.

Yilmaz, "Optimization and Surface Charge Sensitivity of High Voltage Blocking Structures with Shallow Junctions," IEEE Transactions on Electron Devices, vol. 38, No. 3, Jul. 1991, pp. 1666-1675.

Notification of Transmittal of the International Search Report and the Written Opinion of the International Searching Authority, or the Declaration—Corresponding to International Application No. PCT/US2012/023263; Date of Mailing: Aug. 6, 2012; 14 pages.

Japanese Office Action Corresponding to Japanese Patent Application No. 2010-533058; Mailing Date: Nov. 9, 2012; Foreign Text, 3 Pages, English Translation Thereof, 4 Pages.

Notification Concerning Transmittal of International Preliminary Report on Patentability, Application No. PCT/US2012/023263, Date of Mailing: Aug. 22, 2013, 9 pages.

European Office Action corresponding to application No. 08 846 287.4-1555; Date: Jun. 20, 2013, 4 pages.

Japanese Office Action Corresponding to Japanese Patent Application No. 2012-510804; Dispatched Date: Nov. 5, 2013; Foreign Text, 5 Pages, English Translation Thereof, 5 Pages.

Chinese Office Action Corresponding to Chinese Patent Application No. 201080032441.X; Issued Nov. 4, 2013; Foreign Text, 11 Pages, English Translation Thereof, 8 Pages.

* cited by examiner

JUNCTION TERMINATION STRUCTURES INCLUDING GUARD RING EXTENSIONS AND METHODS OF FABRICATING ELECTRONIC DEVICES INCORPORATING SAME

FIELD

The present invention relates to microelectronic devices, and more particularly to edge terminations for microelectronic devices.

BACKGROUND

High voltage silicon carbide (SiC) devices can be capable of handling high voltages, and may handle as much as about 100 amps or more of current, depending on the size of their active area. High voltage SiC devices have a number of important applications, particularly in the field of power conditioning, distribution and control.

A conventional power device structure has an n-type SiC substrate on which an n− epitaxial layer, which functions as a drift region, is formed. The device typically includes a P-N and/or Schottky junction on the n− layer, which acts as a main junction for blocking voltage in the reverse bias direction and providing current flow in the forward bias direction. A p-type junction termination extension (JTE) region, which is typically formed by ion implantation, may surround the main junction. The implants used to form the JTE region may be aluminum, boron, or any other suitable p-type dopant. The purpose of the JTE region is to reduce or prevent the electric field crowding at the edges, and to reduce or prevent the depletion region from interacting with the surface of the device. Surface effects may cause the depletion region to spread unevenly, which may adversely affect the breakdown voltage of the device. Other termination techniques include guard rings and floating field rings that may be more strongly influenced by surface effects. A channel stop region may also be formed by implantation of n-type dopants, such as nitrogen or phosphorus, in order to prevent/reduce extension of the depletion region to the edge of the device.

Additional conventional terminations of SiC Schottky diodes are described in "Planar Terminations in 4H—SiC Schottky Diodes With Low Leakage And High Yields" by Singh et al., ISPSD '97, pp. 157-160. A p-type epitaxy guard ring termination for a SiC Schottky Barrier Diode is described in "The Guard-Ring Termination for High-Voltage SiC Schottky Barrier Diodes" by Ueno et al., IEEE Electron Device Letters, Vol. 16, No. 7, July, 1995, pp. 331-332. Additionally, other termination techniques are described in published PCT Application No. WO 97/08754 entitled "SiC Semiconductor Device Comprising A PN Junction With A Voltage Absorbing Edge."

In addition to junction termination extension (JTE), multiple floating guard rings (MFGR) and field plates (FP) are commonly used termination schemes in high voltage silicon carbide devices. Another conventional edge termination technique is a mesa edge termination.

Field plate termination is also a conventional technique for edge termination of a device and may be cost-effective. In conventional field plate devices, high fields are supported by the oxide layer under the metal field plate. This technique performs well for silicon devices where the highest field in the semiconductor is relatively low. However, in SiC devices the electric fields in the blocking state may be very high (~2 MV/cm) which multiplies by a factor of 2.5 at the oxide-semiconductor interface. This leads to very high oxide fields and may result in long-term reliability problems. Thus, field plate terminations may be unsuitable for use in SiC devices.

The use of multiple floating guard rings in addition to JTE has been proposed as a technique for reducing the sensitivity of the JTE to implant dose variation. See Kinoshita et al., "Guard Ring Assisted RESURF: A New Termination Structure Providing Stable and High Breakdown Voltage for SiC Power Devices," Tech. Digest of ISPSD '02, pp. 253-256. Kinoshita et al. reported that such techniques reduced the sensitivity to implant dose variation. However, the area utilized for termination was increased to almost three times the area of JTE alone as the guard rings are added to both the inner edge of the JTE and the outside of the JTE.

A conventional JTE-terminated PIN diode is illustrated in FIG. 1. As shown therein, a PIN diode 100 includes an n− drift layer 112 between a p+ layer 116 and an n+ substrate 114. FIG. 1 illustrates one half of a PIN-structure; the structure may include mirror image portions (not shown). An anode contact 123 is on the p+ layer 116, and a cathode contact 125 is on the n+ substrate 114. A junction termination extension (JTE) region 120 including a plurality of JTE zones 120A, 120B, 120C is provided in the n− drift layer 112 adjacent the p+ layer 116. The JTE zones 120A, 120B, 120C are p-type regions that may have levels of charge that decrease outwardly in a stepwise fashion with distance from the PN junction between the p+ layer 116 and the n− drift layer 112. Although three JTE zones 120A, 120B, 120C are illustrated, more or fewer JTE zones may be provided.

The JTE zones 120A, 120B, 120C may be formed by successive implantation of ions into the n− drift layer 112. However, such implantation may require multiple mask and implantation steps, increasing the complexity and expense of production. This may be exacerbated as the number of JTE zones is increased. Furthermore, the stepwise doping gradient provided by such an approach may not provide an ideal termination.

Additional conventional terminations of SiC Schottky diodes are described in "Planar Terminations in 4H—SiC Schottky Diodes With Low Leakage And High Yields" by Singh et al., ISPSD '97, pp. 157 160. A p-type epitaxy guard ring termination for a SiC Schottky Barrier Diode is described in "The Guard-Ring Termination for High-Voltage SiC Schottky Barrier Diodes" by Ueno et al., IEEE Electron Device Letters, Vol. 16, No. 7, July, 1995, pp. 331 332. Additionally, other termination techniques are described in published PCT Application No. WO 97/08754 entitled "SiC Semiconductor Device Comprising A PN Junction With A Voltage Absorbing Edge."

Another type of junction termination is disclosed in U.S. Pat. No. 7,026,650, which is assigned to the assignee of the present invention, the disclosure of which is incorporated herein by reference as if set forth fully.

SUMMARY

An electronic device according to some embodiments may include a semiconductor layer having a first conductivity type and having a first surface, and a primary junction in the semiconductor layer at the first surface thereof. A lightly doped region is in the semiconductor adjacent the primary junction and has a second conductivity type that is opposite the first conductivity type, and a junction termination structure is in the lightly doped region. The junction termination structure has, when viewed in a plane of the first surface, an upper boundary, a side boundary, and a corner region between the upper boundary and the side boundary. The lightly doped region extends in a first direction away from the primary junction and normal to a point on the upper boundary by a first distance that is smaller than a second distance by which the lightly doped region extends in a second direction away from the primary junction and normal to a point on the corner.

The junction termination structure may include a guard ring that is adjacent to and spaced apart from the primary junction, wherein the guard ring has the second conductivity type and has a doping concentration that is higher than a doping concentration of the lightly doped region.

The semiconductor layer may include silicon carbide.

The upper boundary of the junction termination structure may be aligned in a <11-20> crystallographic direction of the silicon carbide semiconductor layer and the side boundary of the junction termination structure may be aligned in a <10-10> crystallographic direction of the silicon carbide semiconductor layer.

The corner of the junction termination structure may be in an upper left corner of the electronic device when the upper boundary of the junction termination structure is positioned above the primary junction and the side boundary of the junction termination structure is positioned to the left of the primary junction.

The lightly doped region may extend in the first direction away from the primary junction and normal to the point on the upper boundary by a distance of about 10 micrometers and may extend in the second direction away from the primary junction and normal to the point on the corner by a distance of at least about 20 micrometers.

The first conductivity type may be one of n-type or p-type, and the second conductivity type may be one of p-type or n-type.

The electronic device may include four corner regions, and the lightly doped region extends into each of the four corner regions.

The electronic device may further include at least one floating guard ring segment between the corner of the junction termination structure and a corner of the device, and the corner of the junction termination structure may be between the floating guard ring segment and the primary junction.

The floating guard ring segment may include an implanted region in the semiconductor layer that may be isolated from the junction termination structure. The electronic device may further include a plurality of mutually isolated floating guard ring segments between the corner of the junction termination structure and the corner of the device.

The floating guard ring segment may not extend completely around the primary junction.

The floating guard ring segment may have a radius of curvature about the same as a radius of curvature of the corner of the junction termination structure.

The corner of the lightly doped region may have a first radius of curvature that may be less than a second radius of curvature of the corner of the junction termination structure.

An electronic device according to further embodiments includes a semiconductor layer having a first conductivity type and having a first surface, a primary junction in the semiconductor layer at the first surface thereof, and a junction termination structure in the semiconductor layer and surrounding the primary junction. At least one floating guard ring segment is provided in the semiconductor layer outside the corner of the junction termination structure. The floating guard ring segment may be doped with second conductivity type dopants.

The floating guard ring segment may not extend completely around the primary junction.

The junction termination structure may include a guard ring that is doped with second conductivity type dopants The floating guard ring segment may have a radius of curvature about the same as a radius of curvature of the corner of the guard ring.

An electronic device according to further embodiments includes a semiconductor layer having a first conductivity type and having a first surface, a primary junction in the semiconductor layer at the first surface thereof, and a guard ring termination structure including a lightly doped region having a second conductivity type opposite the first conductivity type at the surface of the semiconductor layer and surrounding the primary junction, and at least one guard ring in the lightly doped region and surrounding the primary junction. The guard ring may be doped with second conductivity type dopants at a doping concentration higher than a doping concentration of the lightly doped region. The guard ring may have, when viewed in a plane of the first surface, an upper boundary, a side boundary, and a corner between the upper boundary and the side boundary. The lightly doped region may extend outside the guard ring in a first direction away from the primary junction by a first distance in a first portion of the lightly doped region adjacent the upper boundary and the lightly doped region extends outside the guard ring in a second direction away from the primary junction by a second distance in a second portion of the lightly doped region adjacent the corner of the guard ring, the second distance may be larger than the first distance.

An electronic device according to further embodiments includes a semiconductor layer having a first conductivity type and having a first surface, a primary junction in the semiconductor layer at the first surface thereof, and a lightly doped region having a second conductivity type opposite the first conductivity type at the surface of the semiconductor layer and surrounding the primary junction. A junction termination structure is provided within the lightly doped region and surrounding the primary junction. The junction termination structure may have, when viewed in a plane of the first surface, an upper boundary, a side boundary, and a corner between the upper boundary and the side boundary and the lightly doped region has, when viewed in a plane of the first surface, an upper boundary, a side boundary, and a corner between the upper boundary and the side boundary. The corner of the lightly doped region may have a first radius of curvature that may be less than a second radius of curvature of the corner of the junction termination structure.

Methods of forming an electronic device according to some embodiments include providing a semiconductor layer having a first conductivity type and having a first surface, providing a primary junction in the semiconductor layer at the first surface thereof, providing a lightly doped region adjacent to the primary junction at the surface of the semiconductor layer and having a second conductivity type opposite the first conductivity type, and providing a junction termination structure in the lightly doped region. The junction termination structure may have, when viewed in a plane of the first surface, an upper boundary, a side boundary, and a corner between the upper boundary and the side boundary. The lightly doped region may extend in a first direction away from the primary junction and normal to a point on the upper boundary by a first distance that is smaller than a second distance by which the lightly doped region extends in a second direction away from the primary junction and normal to a point on the corner.

Methods of forming an electronic device according to further embodiments include providing a semiconductor layer having a first conductivity type and having a first surface, providing a primary junction in the semiconductor layer at the first surface thereof, and providing a junction termination structure at the first surface of the semiconductor layer and surrounding the primary junction. The junction termination structure may have, when viewed in a plane of the first surface, an upper boundary, a side boundary, and a corner between the upper boundary and the side boundary. The methods further include providing at least one floating guard ring segment in the semiconductor layer outside the corner of the junction termination structure, the floating guard ring segment being doped with second conductivity type dopants.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

As is described in more detail below, embodiments of the present invention may provide improved edge termination of semiconductor devices, such as P-N, Schottky, PIN or other such semiconductor devices. Particular embodiments of the present invention provide edge termination for silicon carbide (SiC) devices. For example, embodiments of the present invention may be utilized as edge termination for SiC Schottky diodes, junction barrier Schottky (JBS) diodes, PIN diodes, thyristors, transistors, or other such SiC devices.

Semiconductor power devices are designed to block (in the reverse blocking state) or pass (in the forward operating state) large levels of voltage and/or current. For example, in the reverse blocking state, a semiconductor power device may be designed to sustain hundreds to thousands of volts of electric potential. However, at high reverse voltages, a semiconductor power device may begin to let some current flow through the device. Such current, described as "leakage current" may be highly undesirable. Leakage current may begin to flow if the reverse voltage is increased beyond the design voltage blocking capability of the device, which is typically a function of the doping and thickness of the drift layer. However, leakage current can also begin to flow if the edge termination of the device fails.

A guard ring edge termination of a power semiconductor device may begin to breakdown and allow leakage current to flow at a voltage that is lower than the design voltage of the device. It has been found that such leakage current may begin to flow near particular regions the edge termination. In particular, when a high reverse bias is applied to a silicon carbide-based semiconductor device, leakage current may begin to flow in a region near an upper left corner of a guard ring that is formed on a wafer having a particular crystallographic orientation.

Figure 1:
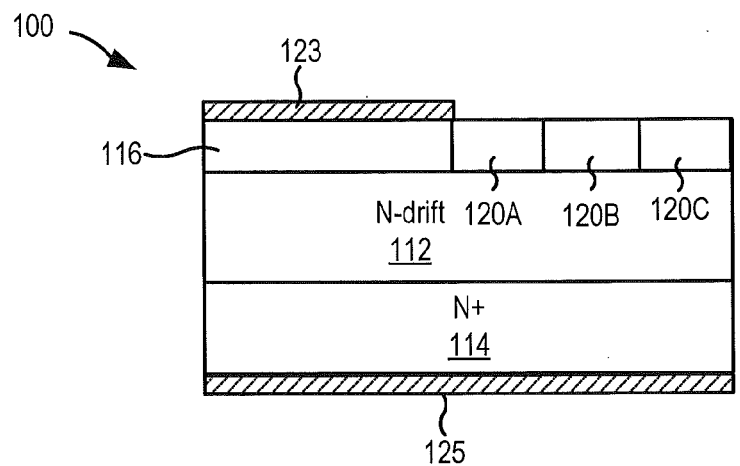
FIG. 1 illustrates a SiC PIN diode with a conventional junction termination extension (JTE) termination.
Figure 2:
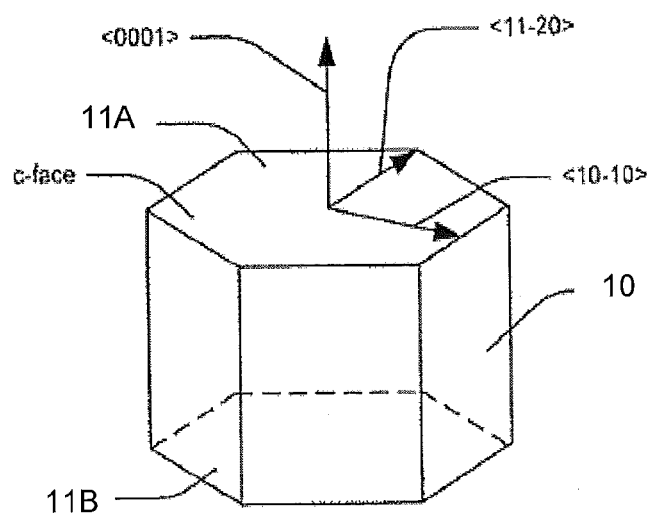
FIG. 2 is a schematic diagram of a hexagonal crystal unit cell structure.

FIG. 2 illustrates a hexagonal unit cell of a hypothetical crystal. The unit cell 10 includes a pair of opposing hexagonal faces 11A, 11B. The hexagonal faces are normal to the c-axis, which runs along the <0001> direction as defined by the Miller-Bravais indexing system for designating directions in a hexagonal crystal. Accordingly the hexagonal faces are sometimes called the c-faces, which define the c-planes or basal planes of the crystal. Planes perpendicular to the c-plane are referred to as prismatic planes.

Figure 3:
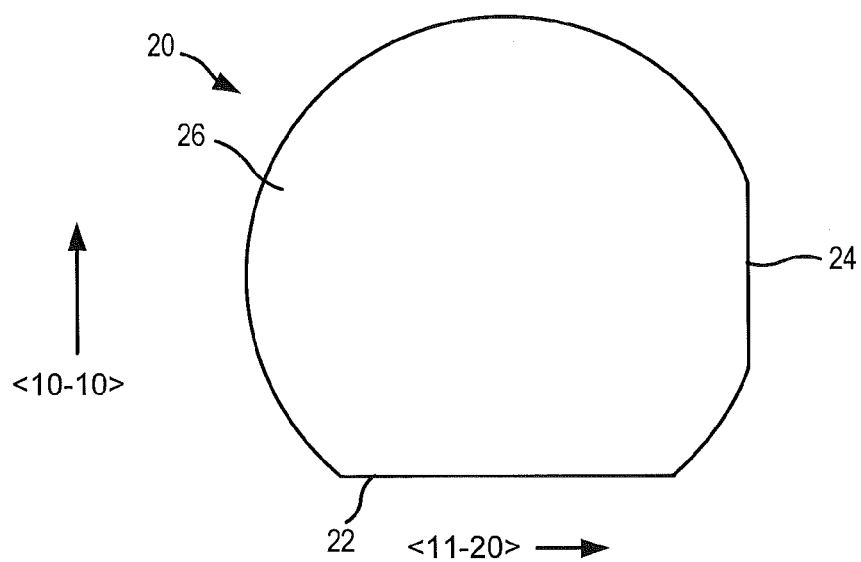
FIG. 3 is a schematic view of a SiC wafer that has been processed to have primary and secondary orientation flats.

FIG. 3 illustrates a single crystal silicon carbide substrate wafer 20 on which a device is to be fabricated. The wafer 20 has a generally circular perimeter. A pair of flats 22, 24 (which are exaggerated for clarity in FIG. 3) has been milled into the wafer 20 to assist in wafer orientation. In particular, the wafer 20 includes a primary flat 22 and a secondary flat 24. The primary flat 22 is in the {10-10} plane and runs along the <11-20> crystallographic direction, while the secondary flat 24 is in the {11-20} plane and runs along the <10-10> crystallographic direction. When viewed from the carbon face of the wafer, the primary flat 22 is on the bottom of the wafer and the secondary flat 24 is on the right side of the wafer.

The surface 26 of the wafer corresponds generally to the c-face of the silicon carbide crystal (except that the wafer may be cut at an off-axis angle α towards the <11-20> direction to accommodate epitaxial growth.

Figure 4:
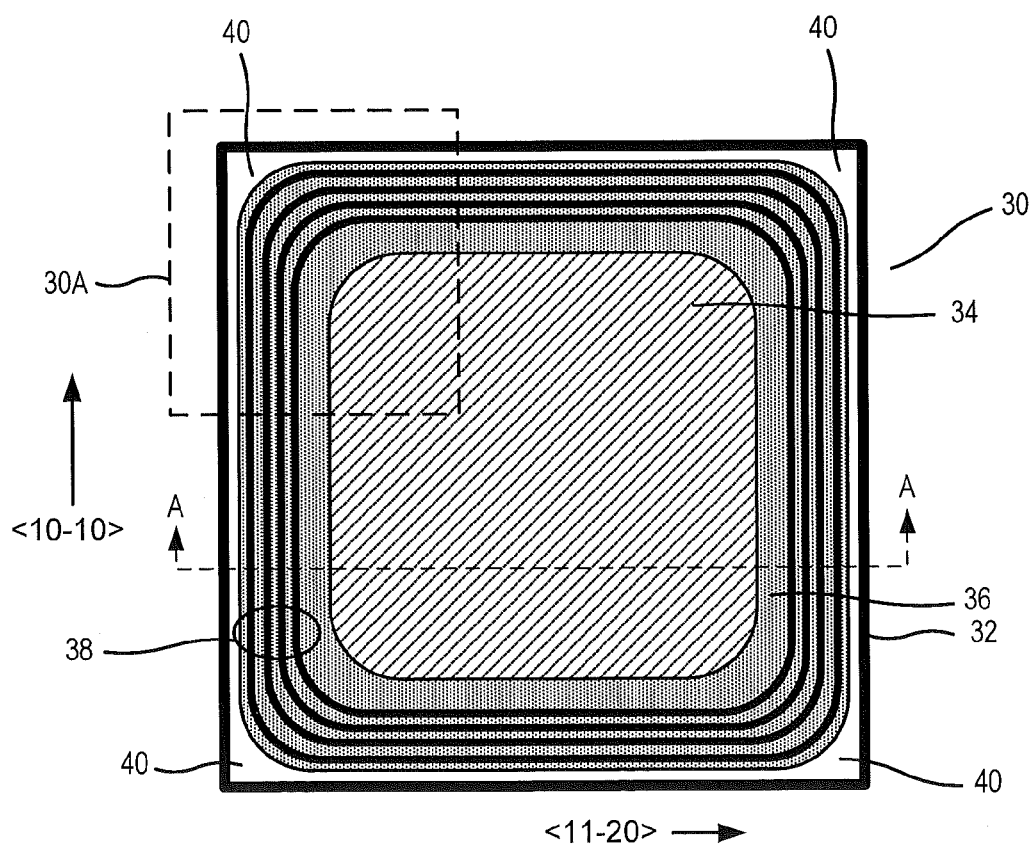
FIG. 4 is a plan view of a PIN diode having an unused corner region.
Figure 5:
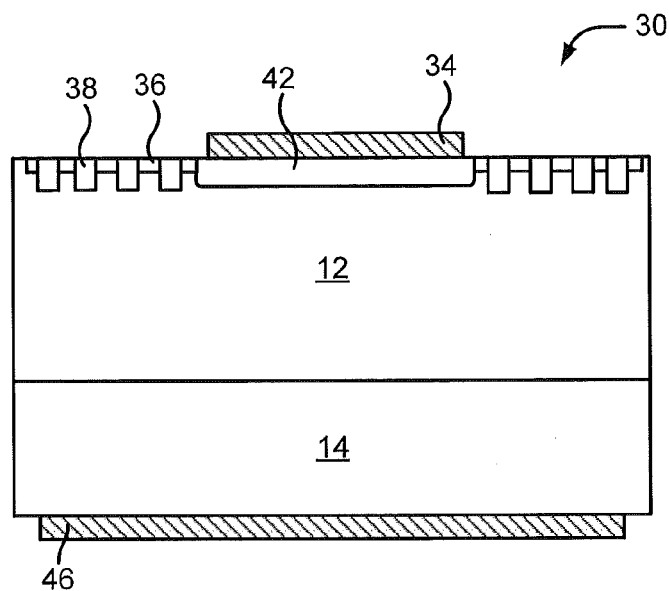
FIG. 5 is a cross sectional view of the device of FIG. 4.
Figure 6:
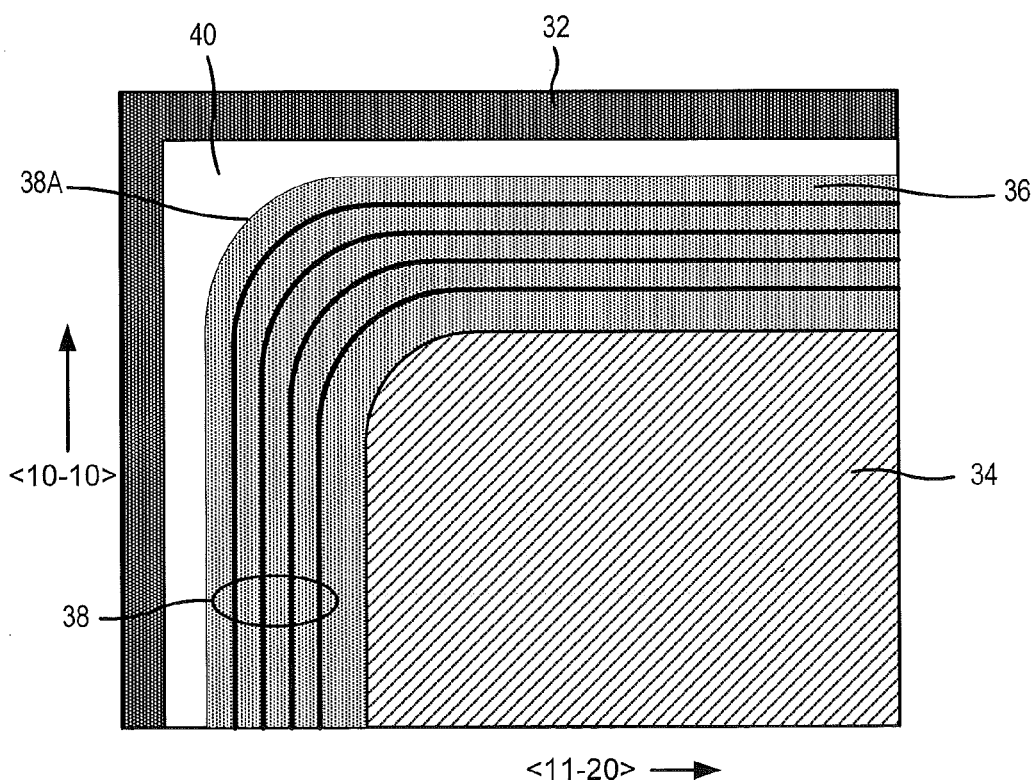
FIG. 6 is a detail plan view of a portion of the device of FIG. 4.

A PIN diode 30 with a guard ring termination is illustrated in FIGS. 4-6. In particular, FIG. 4 is a plan view of a power semiconductor device 30, such as a silicon carbide PIN diode, FIG. 5 is a cross section taken along line A-A of FIG. 4, and FIG. 6 is a detailed view of an upper corner region 30A of the device 30.

The device 30 may be formed within an area of a silicon carbide substrate 26 that is defined by a plurality of dicing streets 32 at which the substrate will be sawn to separate the fabricated devices.

The device 30 includes a silicon carbide substrate 14. The substrate may be doped with dopants having a first conductivity type, and may have a polytype of 2H, 4H, 6H, 3C and/or 15R.

The device 30 includes a lightly doped drift layer 12 of the first conductivity type and a region 42 having a second conductivity type that is opposite the first conductivity type and that forms a PN junction with the drift layer 12. Assuming the first conductivity type is n-type and the second conductivity type is p-type, an anode contact 34 is on the p-type region 42, and a cathode contact 46 is on the n-type substrate 14.

A guard ring structure is provided on the surface of the drift layer 12 adjacent the PN junction between the region 42 and the drift layer 12. The guard ring structure includes a plurality of guard rings 38 of the second conductivity type that form concentric rings around the active region of the device (i.e., the region including the main PN junction). The guard rings 38 may be formed, for example, by ion implantation. Guard ring formation is described in detail in U.S. Pat. No. 7,026,650 entitled "Multiple Floating Guard Ring Edge Termination for Silicon Carbide Devices" issued on Apr. 11, 2006 and U.S. Publication No. 2006/0118792 entitled "Edge Termination Structures For Silicon Carbide Devices And Methods Of Fabricating Silicon Carbide Devices Incorporating Same"

published on Jun. 8, 2006, which are assigned to the assignee of the present invention and which are incorporated herein by reference.

Also included in the structure is a lightly doped region 36 of the second conductivity type that is provided between the guard rings 38 at the surface of the drift layer 12. The lightly doped region 36 may extend outside the outermost guard ring 38, and may be formed to a depth in the drift layer 12 that is less than the depth to which the guard rings extend. In some embodiments, the lightly doped region 36 may provide a surface charge compensation region as discussed, for example in the above referenced U.S. Pat. No. 7,026,650 and U.S. Publication No. 2006/0118792. In some other embodiments, the lightly doped region may provide a reduced surface field (RESURF) region at the surface of the draft layer, as discussed, for example, in U.S. Pat. No. 7,026,650 and U.S. Publication No. 2006/0118792. The lightly doped region 36 may extend completely or incompletely between adjacent guard rings 38. Furthermore, the lightly doped region 36 may extend deeper or shallower into the drift layer 12 than the guard rings 38.

Referring to FIGS. 4 and 6, when viewed from above, the guard rings 38 may be rounded at the corners of the device to help reduce leakage current that may otherwise occur if the guard rings were formed to have sharp corners at which voltage can peak. However, rounding the corners of the guard rings 38 can result in loss of potentially useful area of the die. That is, rounding the corners 38 creates a corner region 40 of unused space between the corners of the region defined by the dicing streets 32 and the rounded corner 38A of the outermost guard ring 38. Some embodiments take advantage of this "lost" space by forming structures and/or features therein that may reduce leakage current, particular at the most vulnerable corners of the device.

As illustrated in FIG. 4, the device 30 can be oriented on a wafer 20 so that the dicing streets 32 are parallel to defined orthogonal directions of the substrate. For example, two of the dicing streets 32 can be parallel to the <11-20> direction, while two of the dicing streets 32 can be parallel to the <10-10> direction.

Figure 7:
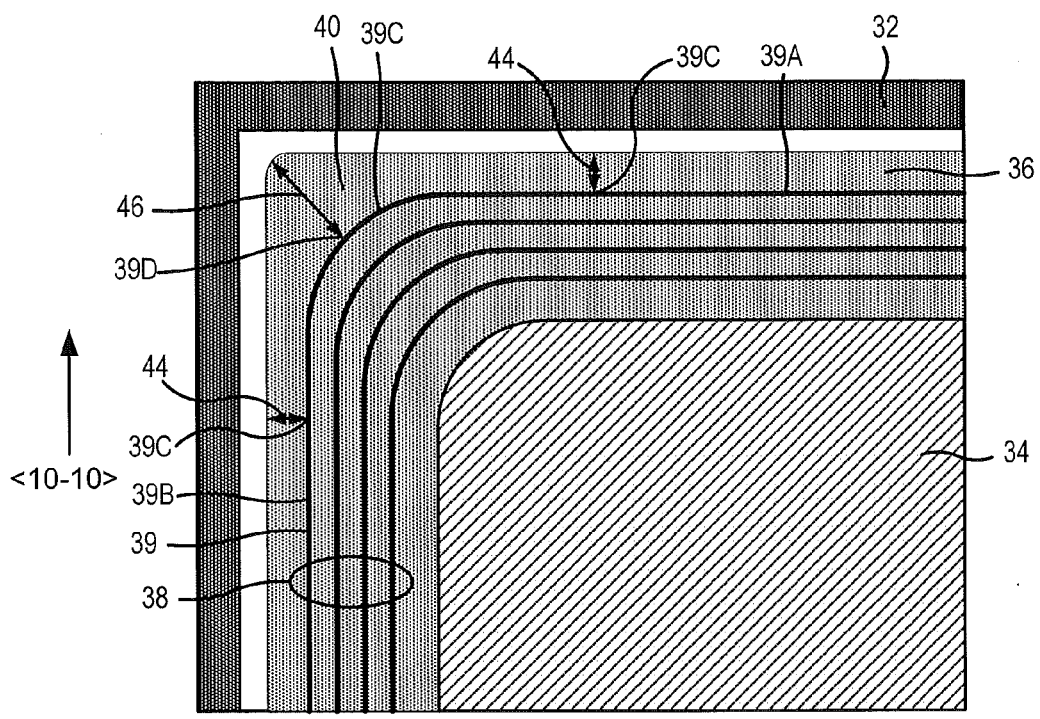
FIGS. 7, 8 and 9 are detail plan views of portions of electronic devices according to some embodiments.

Referring to FIG. 7, in some embodiments the lightly doped region 36 may extend into one or more of the corner regions 40 between the corners of the dicing streets 32 and the outermost guard ring 39. The lightly doped region 36 may thus be formed to have a smaller radius of curvature than the outermost guard ring 39 in the corner region 40. In some embodiments, the lightly doped region 36 may be extended in all corner regions. In other embodiments, the lightly doped region 36 may be extended in fewer than all corner regions, for example the lightly doped region 36 may be extended in only one corner region.

In one aspect, the lightly doped region 36 may extend in a first direction 46 away from the primary junction and normal to a point 39D on the corner of the outermost guard ring 39 by a distance larger than a distance by which the lightly doped region 36 extends in a direction 44 away from the primary junction and normal to a point 39C on a boundary 39A, 39B of the outermost guard ring 39. Stated differently, the lightly doped region 36 may extend outside the outermost guard ring 39 in a first direction 46 away from the primary junction by a first distance in a first portion of the lightly doped region adjacent the corner region 40, and may extend outside the outermost guard ring 39 in a second direction 44 away from the primary junction in a second portion of the lightly doped region the adjacent a boundary 39A of the outermost guard ring 39 by a second distance 46 which is larger than the first distance 44.

In some embodiments, the lightly doped region 36 may extend in a direction 44 away from the primary junction and normal to a point 39C on a boundary 39A, 39B of the outermost guard ring 39 by about 10 micrometers, and may extend in a direction 46 away from the primary junction and normal to a point 39D on the corner of the outermost guard ring 39 by at least about 20 micrometers.

Extending the lightly doped region 36 as described above may help to reduce and/or spread the electric field in a region that is vulnerable to electric breakdown at high reverse bias voltages. This may reduce leakage current from the device, potentially resulting in improved yields and/or a reduction in die size for similar breakdown voltages. Extending the lightly doped region 36 may be performed without increasing the overall size of the die, as the lightly doped region may be extended into previously unused space between the corner of the outermost guard ring and the outer corner of the device.

Figure 8:
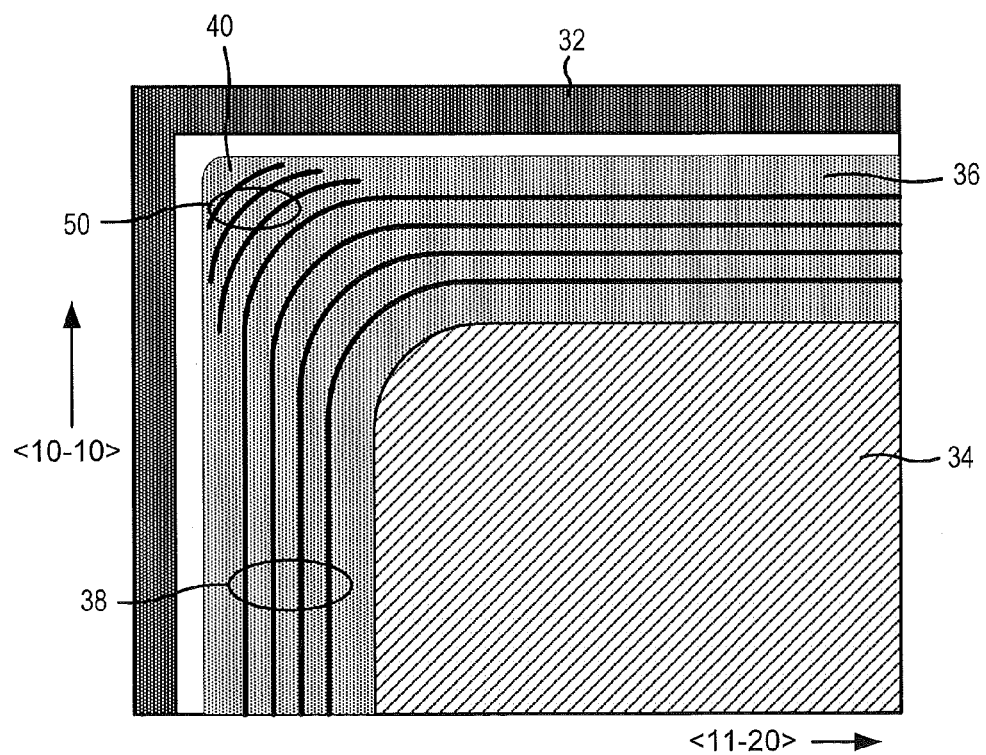
Figure 9:
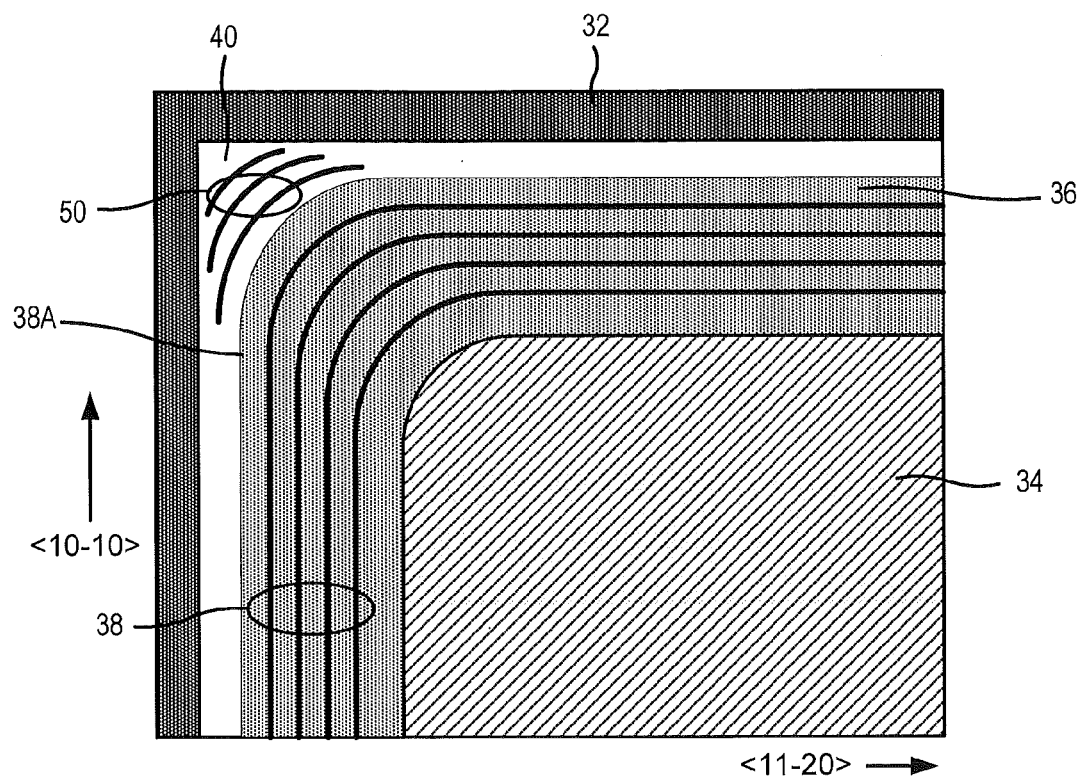

Further embodiments are illustrated in FIGS. 8 and 9. As shown therein, one or more supplemental guard ring segments 50 may be provided as isolated implanted regions of the second conductivity type in one or more of the corner regions 40 between a corner of the outermost guard ring and an outer corner of the device. The guard ring segments 50 may have a radius of curvature the same as or similar to the radius of the guard rings 38 in the corner region 40 in some embodiments.

In some embodiments, the guard ring segments 50 may be provided in all corner regions. In other embodiments, the guard ring segments 50 may be provided in fewer than all corner regions, for example the guard ring segments 50 may be provided in only one corner region.

In some embodiments, the guard ring segments 50 may be provided inside the extension of the lightly doped regions 36 into the corner region 40, as shown in FIG. 8. In other embodiments as shown in FIG. 9, the guard ring segments 50 may be provided without extending the lightly doped regions 36 into the corner region 40. Although the guard ring segments 50 may not extend completely around the main junction of the device in the manner of the guard rings 38, they may still help to spread out the electric field in the vulnerable corner region 40, thereby increasing the breakdown voltage of the device.

Figure 10:
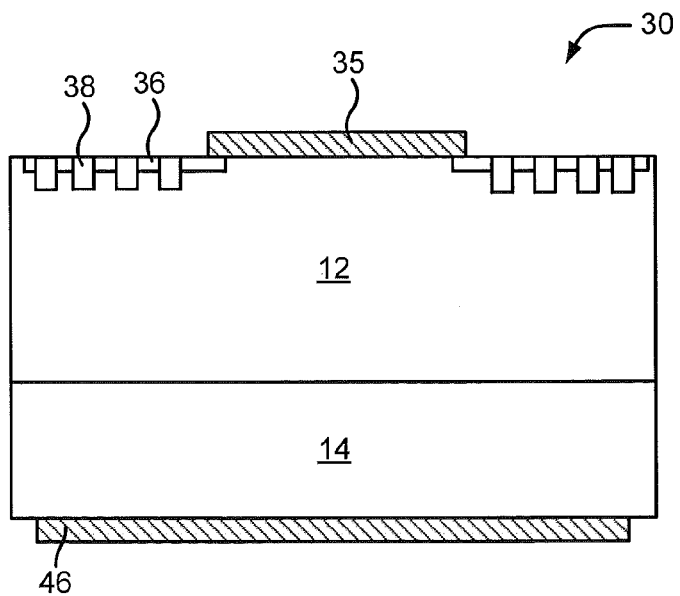
FIG. 10 is a cross sectional view of a Schottky diode according to some embodiments.

Although embodiments of the invention have been described with regard to PIN diode devices, embodiments of the invention can be used in conjunction with other types of devices, and/or devices having other types of junctions. For example, FIG. 10 is a cross sectional view of a Schottky diode structure 31 according to some embodiments that includes a Schottky contact 35 that forms a rectifying Schottky junction with the underlying drift layer 12.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to herein as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "beneath," "over," etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention have been described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention have been described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An electronic device, comprising:
a semiconductor layer having a first conductivity type and having a first surface;
a primary junction in the semiconductor layer at the first surface thereof;
a lightly doped region adjacent the primary junction and having a second conductivity type that is opposite the first conductivity type, the lightly doped region not extending beyond an area defined by the first surface; and
a junction termination structure in the lightly doped region, wherein the junction termination structure has, when viewed in a plane of the first surface, an upper boundary, a side boundary, and a corner region between the upper boundary and the side boundary;
wherein the lightly doped region extends in a first direction away from the primary junction and normal to a point on the upper boundary by a first distance that is smaller than a second distance by which the lightly doped region extends in a second direction away from the primary junction and normal to a point on the corner region.

2. The electronic device of claim 1, wherein the junction termination structure comprises a guard ring that is adjacent to and spaced apart from the primary junction, wherein the guard ring has the second conductivity type and has a doping concentration that is higher than a doping concentration of the lightly doped region.

3. The electronic device of claim 1, wherein the semiconductor layer comprises silicon carbide.

4. The electronic device of claim 1, wherein the corner of the junction termination structure is in an upper left corner of the electronic device when the upper boundary of the junction termination structure is positioned above the primary junction and the side boundary of the junction termination structure is positioned to the left of the primary junction.

5. The electronic device of claim 1, wherein the lightly doped region extends in the first direction away from the primary junction and normal to the point on the upper boundary by a distance of about 10 micrometers and extends in the second direction away from the primary junction and normal to the point on the corner by a distance of at least about 20 micrometers.

6. The electronic device of claim 1, wherein the first conductivity type is one of n-type or p-type, and the second conductivity type is one of p-type or n-type.

7. The electronic device of claim 1, wherein the electronic device comprises four corner regions, and wherein the lightly doped region extends into each of the four corner regions.

8. The electronic device of claim 1, wherein the corner of the lightly doped region has a first radius of curvature that is less than a second radius of curvature of the corner of the junction termination structure.

9. The electronic device of claim 1, wherein the junction termination structure is entirely within the lightly doped region.

10. An electronic device, comprising:
a semiconductor layer having a first conductivity type and having a first surface;
a primary junction in the semiconductor layer at the first surface thereof;
a lightly doped region adjacent the primary junction and having a second conductivity type that is opposite the first conductivity type; and
a junction termination structure in the lightly doped region, wherein the junction termination structure has, when viewed in a plane of the first surface, an upper boundary, a side boundary, and a corner region between the upper boundary and the side boundary;
wherein the lightly doped region extends in a first direction away from the primary junction and normal to a point on the upper boundary by a first distance that is smaller than a second distance by which the lightly doped region extends in a second direction away from the primary junction and normal to a point on the corner region
wherein the junction termination structure comprises a guard ring that is adjacent to and spaced apart from the primary junction, wherein the guard ring has the second conductivity type and has a doping concentration that is higher than a doping concentration of the lightly doped region;
wherein the semiconductor layer comprises silicon carbide; and
wherein the upper boundary of the junction termination structure is aligned in a <11-20> crystallographic direction of the silicon carbide semiconductor layer and the side boundary of the junction termination structure is aligned in a <10-10> crystallographic direction of the silicon carbide semiconductor layer.

11. An electronic device, comprising:
a semiconductor layer having a first conductivity type and having a first surface;
a primary junction in the semiconductor layer at the first surface thereof;
a lightly doped region adjacent the primary junction and having a second conductivity type that is opposite the first conductivity type; and
a junction termination structure in the lightly doped region, wherein the junction termination structure has, when viewed in a plane of the first surface, an upper boundary, a side boundary, and a corner region between the upper boundary and the side boundary;
wherein the lightly doped region extends in a first direction away from the primary junction and normal to a point on the upper boundary by a first distance that is smaller than a second distance by which the lightly doped region extends in a second direction away from the primary junction and normal to a point on the corner region;
wherein the electronic device further comprises at least one floating guard ring segment between the corner of the junction termination structure and a corner of the device, wherein the corner of the junction termination structure is between the floating guard ring segment and the primary junction.

12. The electronic device of claim 11, wherein the floating guard ring segment comprises an implanted region in the semiconductor layer that is isolated from the junction termination structure.

13. The electronic device of claim 11, further comprising a plurality of mutually isolated floating guard ring segments between the corner of the junction termination structure and the corner of the device.

14. The electronic device of claim 11, wherein the floating guard ring segment does not extend completely around the primary junction.

15. The electronic device of claim 11, wherein the floating guard ring segment has a radius of curvature about the same as a radius of curvature of the corner of the junction termination structure.

16. An electronic device, comprising:
a semiconductor layer having a first conductivity type and having a first surface;
a primary junction in the semiconductor layer at the first surface thereof;
a lightly doped region having a second conductivity type opposite the first conductivity type at the first surface of the semiconductor layer and adjacent the primary junction, the lightly doped region not extending beyond an area defined by the first surface; and
a junction termination structure entirely within the lightly doped region;
wherein the junction termination structure has, when viewed in a plane of the first surface, an upper boundary, a side boundary, and a corner between the upper boundary and the side boundary and the lightly doped region has, when viewed in a plane of the first surface, an upper boundary, a side boundary, and a corner between the upper boundary and the side boundary; and
wherein the corner of the lightly doped region has a first radius of curvature that is less than a second radius of curvature of the corner of the junction termination structure.

17. A method of forming an electronic device, comprising:
providing a semiconductor layer having a first conductivity type and having a first surface;
providing a primary junction in the semiconductor layer at the first surface thereof; and
providing a lightly doped region adjacent to the primary junction at the first surface of the semiconductor layer and having a second conductivity type opposite the first conductivity type, the lightly doped region not extending beyond an area defined by the first surface; and
providing a junction termination structure in the lightly doped region; wherein the junction termination structure has, when viewed in a plane of the first surface, an upper boundary, a side boundary, and a corner between the upper boundary and the side boundary; and
wherein the lightly doped region extends in a first direction away from the primary junction and normal to a point on the upper boundary by a first distance that is smaller than a second distance by which the lightly doped region extends in a second direction away from the primary junction and normal to a point on the corner.

* * * * *